United States Patent
Yamakawa et al.

[11] Patent Number: 5,134,461
[45] Date of Patent: Jul. 28, 1992

[54] CERAMICS SUBSTRATE WITH AN IMPROVED SURFACE STRUCTURE FOR ELECTRONIC COMPONENTS

[75] Inventors: Akira Yamakawa; Akira Sasame, both of Hyogo, Japan

[73] Assignee: Sumitomo Electric Industries, Ltd., Osaka, Japan

[21] Appl. No.: 623,204

[22] Filed: Dec. 6, 1990

[30] Foreign Application Priority Data

Dec. 7, 1989 [JP] Japan ............................ 1-318250

[51] Int. Cl.⁵ .............................................. H01L 23/14
[52] U.S. Cl. ........................................ 357/71; 357/80; 357/67; 428/680
[58] Field of Search ............... 357/80, 67, 74, 81, 357/71; 437/190, 192, 194; 428/680, 672; 174/258, 255, 257; 427/404, 123, 125

[56] References Cited

U.S. PATENT DOCUMENTS

| | | | |
|---|---|---|---|
| 3,242,391 | 3/1966 | Gorman | 357/67 |
| 4,910,094 | 3/1990 | Watanabe et al. | 428/610 |
| 5,023,407 | 6/1991 | Shirai et al. | 174/259 |

FOREIGN PATENT DOCUMENTS

| | | | |
|---|---|---|---|
| 0032020 | 10/1975 | Japan | 357/67 |
| 0001858 | 1/1978 | Japan | 357/67 |
| 59-114846 | 7/1984 | Japan | |
| 60-56073 | 4/1985 | Japan | |

*Primary Examiner*—Rolf Hille
*Assistant Examiner*—S. V. Clark
*Attorney, Agent, or Firm*—W. G. Fasse; D. H. Kane

[57] ABSTRACT

A ceramic substrate has a surface structure capable of suppressing diffusion of Ni into an Au plating layer by providing an NiAu alloy layer between the substrate and the Au plating layer, whereby the thickness of the Au plating layer may be reduced. Such a surface structure is formed by applying the following layers to the substrate, a metallized layer (12), Ni an layer (13) and Au layer (14) in this order. The substrate (11) is heated in a non-oxidizing atmosphere to cause an alloying reaction between the Ni layer (13) and the Au layer (14). Thereafter, an Au plating layer (16) is formed on the NiAu alloy layer (15). Since Ni in the NiAu alloy layer is not easily released, diffusion of Ni into the Au plating layer is suppressed sufficiently.

8 Claims, 2 Drawing Sheets

CERAMICS SUBSTRATE WITH AN IMPROVED SURFACE STRUCTURE FOR ELECTRONIC COMPONENTS

BACKGROUND OF THE INVENTION

1. Field of the Invention

The present invention relates to ceramic substrates for mounting electronic components and the like thereon, and more particularly to a surface structure of a ceramics substrate having a superior heat resistance. A method of manufacturing such a substrate is also disclosed.

2. Background Information

A surface of a ceramics substrate is metallized to mount or seal electronic components. With reference to FIG. 1 showing a conventional surface structure of a ceramics substrate, a refractory metal 2 such as W or Mo is formed by baking on a ceramic substrate 1 of alumina, for example. An Ni plating layer 3 is formed on the metal 2, and an Au plating layer 4 is formed on the same layer 3. The Ni plating layer 3 facilitates soldering of the electronic components or the like, and serves to protect the metallized layer 2 formed thereunder. The Au plating layer 4 prevents oxidation of the Ni plating layer 3 formed thereunder to provide a superior connection between the Ni plating layer 3 and the electronic components, thereby maintaining by an excellent reliability of the electronic components and the like.

When elements are to be bonded on the Au plating by soldering, the ceramics substrate or the surface of the ceramics substrate is heated. However, the uppermost Au layer is tarnished by the heating, which prevents forming an excellent bonding. The cause of the tarnish of the Au plating layer may be diffusion caused by heating of Ni of the Ni plating layer into the Au plating layer whereby Ni is coupled with oxygen introduced from the air to form Ni oxide.

In order to avoid the above described problem, the thickness of the Au plating layer is generally made as thick as about 2 μm. However, in order to reduce cost, the Au plating layer should preferably be reduced in thickness.

Japanese Patent Laying Open No. 59-114846 discloses a method of suppressing the diffusion of Ni from the Ni plating layer to the Au plating layer. More specifically, after the Ni plating layer is formed, the Ni plating layer is heat treated within a temperature range of 900° C. to 1400° C. in a reducing atmosphere, so as to improve the heat resistance of the Ni plating layer.

However, the above method cannot sufficiently prevent tarnishing of the Au plating layer. Especially when the thickness of the Au plating layer is not larger than 1 μm, the Au plating layer is tarnished when electronic components and the like are bonded.

SUMMARY OF THE INVENTION

The present invention was made with a view of avoiding the foregoing problem by providing a surface structure of a ceramics substrate capable of suppressing diffusion of Ni from the Ni layer into the Au plating layer and by also reducing the thickness of the Au plating layer to reduce costs.

The surface structure of the ceramics substrate in accordance with the present invention comprises an Au plating layer and an NiAu alloy layer below the Au layer on the surface of the ceramics substrate.

The surface structure of the ceramics substrate in accordance with the present invention, may be manufactured by forming a metallized layer, a Ni layer and an Au layer in this order on the surface of the ceramics substrate, the substrate is heated in a non-oxidizing atmosphere to cause an alloying reaction between the Ni layer and the Au layer, and then an Au plating layer is formed on the NiAu alloy layer.

In the present invention, the NiAu alloy layer is positioned below the Au plating layer. Since Ni in the NiAu alloy layer is not easily released, diffusion of Ni into the Au plating layer can be suppressed sufficiently. Therefore, the Au plating layer can be reduced in thickness.

DESCRIPTION OF THE PREFERRED EMBODIMENTS

Figure 1:
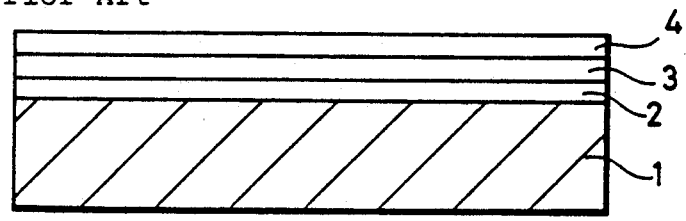
FIG. 1 is a sectional view showing a conventional surface structure of a ceramics substrate.
Figure 2A:
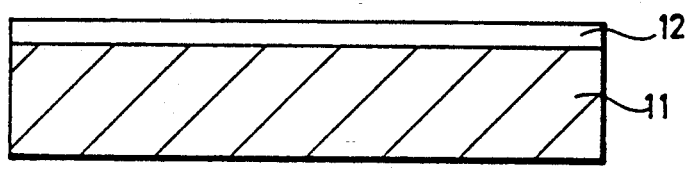
FIGS. 2A to 2E are sectional views for explaining a method of manufacturing a surface structure of a ceramics substrate in accordance with the present invention.

First, a metallized layer 12 is formed on a ceramics substrate 11, as illustrated in FIG. 2A. A refractory metal such as W, Mo or Ta may be employed as a metal for forming the metallized layer 12. A plating layer is formed on the refractory metal layer 12. Vapor deposition, ion plating, sputtering or the like may be employed to form the metallized layer.

Figure 2B:
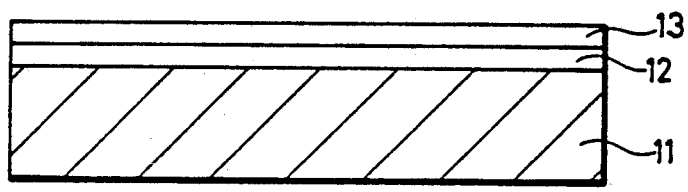

As illustrated in FIG. 2B, an Ni layer 13 is formed on the metallized layer 12. Various methods may be used for forming the Ni layer 13. Preferably, an electrolytic plating method is employed. Electroless plating may be employed. However, the Ni layer need not be formed by the plating method, rather vapor deposition, ion plating or sputtering may be used to form the Ni layer 13.

Figure 2C:
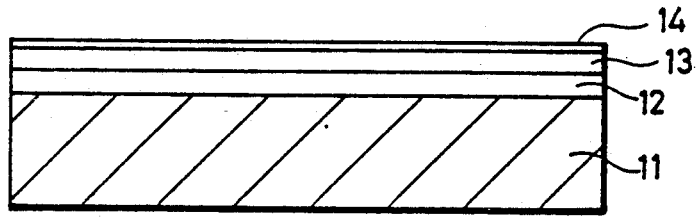

Then an Au layer 14 is formed on the Ni layer 13, as illustrated in FIG. 2C. At this time, the Au plating layer 14 may be formed by a usual plating method or by vapor deposition, ion plating or sputtering. The Ni layer may be formed not directly on the metallized layer. The Ni layer may be formed after another metal layer is formed.

The above mentioned Ni layer 13 and the Au layer 14 should have as uniform a thickness as possible on the entire surface, respectively. If these layers are not uniform in thickness, a color shade may be generated. The ratio of thickness of the Au layer 14 to that of Ni layer 13 is preferably not larger than ½. If the thickness of the Au layer 14 is larger than this ratio, it will be difficult to have a suitable alloy layer by the alloying processing described later. The most preferable ratio of the thickness of the Au layer 14 to the Ni layer 13 is not higher than 1/10.

Figure 2D:
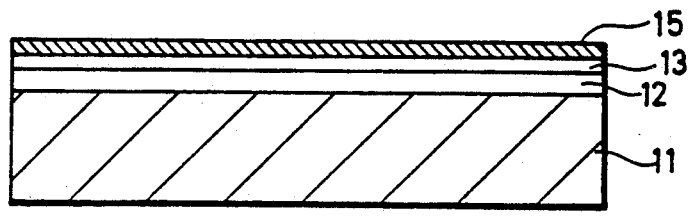

Then the ceramics substrate 11 having the metallized layer 12, the Ni layer 13 and the Au layer 14 thereon is heated for 4 to 5 minutes in a non-oxidizing atmosphere at a temperature higher than 500° C. to cause an alloying reaction between the Ni layer 13 and the Au layer 14. By this heat treatment, an NiAu alloy layer 15 is formed as the uppermost layer, as illustrated in FIG. 2D.

Figure 2E:
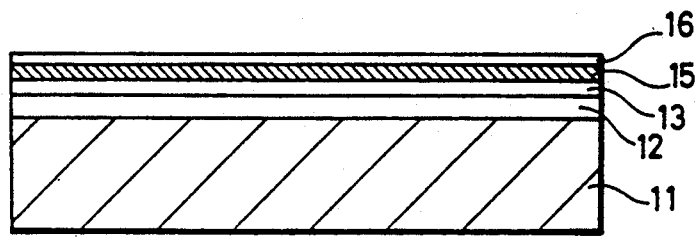

Then an Au plating layer 16 is formed by usual plating method on the NiAu alloy layer 15, as illustrated in FIG. 2E. Preferably, an electrolytic plating method or electroless plating method is employed to form the Au plating layer 16. The heat resistance is improved as the thickness of the Au plating layer 16 is increased. However, since the NiAu alloy layer 15 below suppresses the release of Ni, diffusion of Ni to the Au plating layer 16 can be substantially prevented. Therefore, even if the thickness of the Au plating layer 16 is not larger than 1.0 μm, tarnishing of the Au plating layer 16 is not generated during the heating for bonding the electronic components and the like. The heat treatment for bonding is usually carried out at a temperature of 450° C. for three min. Since the NiAu alloy layer 15 suppresses the release of Ni, a sufficient thickness of the Au plating layer 16 is generally about 0.2 μm. In any case, the thickness of the Au plating layer 16 is determined in accordance with the necessary characteristics.

EXAMPLE

16 AlN substrates having a metallized layer of W were prepared. An Ni plating layer was formed under various conditions on each substrate, and an Au plating layer was formed on the plating layer. Table 1 shows the thicknesses of the plating layers corresponding to the respective samples.

TABLE 1

| Sample No. | Ni plating thickness(μm) | Au plating thickness(μm) | Heating temperature (°C.) | Uppermost Au plating layer(μm) | Tarnish evaluation |
| --- | --- | --- | --- | --- | --- |
| 1 | 3 | 0.1 | 900 | 0.05 | Δ |
| 2 | 3 | 0.1 | 900 | 0.1 | o |
| 3 | 3 | 0.1 | 900 | 0.3 | o |
| 4 | 3 | 0.1 | 900 | 0.8 | o |
| 5 | 3 | 0.1 | 900 | 1.0 | o |
| 6 | 3 | 0.1 | 400 | 0.5 | Δ |
| 7 | 3 | 0.1 | 700 | 0.5 | o |
| 8 | 3 | 0.1 | 1000 | 0.5 | o |
| 9 | 3 | 0.1 | — | 0.5 | X |
| 10 | 1 | 0.1 | 900 | 0.5 | Δ |
| 11 | 5 | 0.1 | 900 | 0.5 | o |
| 12 | 7 | 0.1 | 900 | 0.5 | o |
| 13 | 5 | 0.2 | 900 | 0.5 | o |
| 14 | 5 | 1.0 | 900 | 0.5 | o |
| 15 | 4 | 0.2 | 900 | 0.5 | o |
| 16 | 4 | 0.2 | 900 | 0.5 | o |

Except for sample No. 9, a heat treatment was carried out for fifteen samples with different heating temperatures in a current of hydrogen, to cause an alloying reaction between the Ni plating layer and the Au plating layer. Finally, an Au plating layer was formed as the uppermost layer on each of the samples.

The tarnish of the uppermost Au plating layer of each sample was evaluated. The evaluation was carried out by heat-treating the finally obtained samples for 5 minutes in an atmosphere of 450° C., and the tarnish of the uppermost Au plating layer after heat treatment was examined. In Table 1, the mark o represents no tarnish, mark Δ represents slight tarnish and X represents serious tarnish.

On the sample No. 15, an Ni layer having the thickness of 4 μm was formed by sputtering and an Au plating layer having the thickness of 0.2 μm was formed thereon by plating. On the sample No. 16, an Ni layer having the thickness of 4 μm was formed by sputtering, and an Au layer having the thickness of 0.2 μm was formed thereon by sputtering. Although tarnish was not exhibited on the sample No. 14, color shade appeared.

As to the sample No. 9 which exhibited serious tarnish, a heat treatment for alloying reaction was not carried out on this sample. This is the cause of the serious tarnish of the uppermost Au plating layer.

As to the sample No. 1, the thickness of the uppermost Au plating layer was considerably smaller compared with the other samples. Since the uppermost Au plating layer was too small in thickness, slight tarnish occurred.

As to the sample No. 6, the heating temperature for the alloying reaction was lower compared with other samples. The lower temperature is considered to be the cause of the tarnish.

As to the sample No. 10, the thickness of the Ni plating layer was considerably smaller than other samples. This is considered to be the cause of tarnish of the uppermost Au plating layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ceramics substrate having a surface, comprising a nickel layer on said surface, an NiAu alloy layer on said nickel layer, and an Au plating layer on said NiAu alloy layer, whereby said NiAu alloy layer protects said Au layer against tarnishing by suppressing diffusion of Ni into said Au layer.

2. The ceramics substrate according to claim 1, further comprising a metallized layer formed under said NiAu alloy layer.

3. The ceramics substrate according to claim 1, wherein a thickness of said Au plating layer is 1.0 μm at the most.

4. The ceramics substrate according to claim 1, wherein a thickness of said Au plating layer is in the range of 0.2 μm to 1.0 μm.

5. A ceramics substrate having a surface structure, comprising an AlN substrate, a metallized layer of a refractory metal formed on said AlN substrate, an Ni layer formed on said metallized layer, an NiAu alloy layer formed on said Ni layer, and an Au plating layer formed on said NiAu alloy layer.

6. The ceramics substrate according to claim 5, wherein a thickness of said Au plating layer is in the range of 0.2 μm to 1.0 μm.

7. The ceramics substrate according to claim 5, wherein said refractory metal is W, Mo or Ta.

8. A ceramics substrate having a surface, comprising a nickel layer on said surface, an NiAu alloy layer on said nickel layer, and an Au plating layer having a thickness of 1.0 μm at the most on said NiAu alloy layer, whereby said NiAu alloy layer protects said Au layer against tarnishing by suppressing diffusion of Ni into said Au layer.

* * * * *